United States Patent
Sun et al.

(10) Patent No.: US 9,614,185 B2
(45) Date of Patent: Apr. 4, 2017

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Tao Sun, Beijing (CN); Tao Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/768,251

(22) PCT Filed: Jan. 20, 2015

(86) PCT No.: PCT/CN2015/071095
§ 371 (c)(1),
(2) Date: Aug. 17, 2015

(87) PCT Pub. No.: WO2016/033931
PCT Pub. Date: Mar. 10, 2016

(65) Prior Publication Data
US 2016/0254489 A1 Sep. 1, 2016

(30) Foreign Application Priority Data
Sep. 1, 2014 (CN) .......................... 2014 1 0440269

(51) Int. Cl.
*H01L 51/52* (2006.01)
*H01L 51/56* (2006.01)

(52) U.S. Cl.
CPC .......... *H01L 51/5256* (2013.01); *H01L 51/56* (2013.01); *H01L 2251/5338* (2013.01)

(58) Field of Classification Search
CPC ............................ H01L 27/32–27/3297; H01L 51/5237–51/5259
See application file for complete search history.

(56) References Cited

U.S. PATENT DOCUMENTS

2003/0038590 A1* 2/2003 Silvernail ........... H01L 51/5259
313/504
2010/0215929 A1 8/2010 Seo et al.
(Continued)

FOREIGN PATENT DOCUMENTS

CN 102201547 A 9/2011
CN 102664239 A 9/2012
(Continued)

OTHER PUBLICATIONS

International Search Report dated May 27, 2015 for International Application No. PCT/CN2015/071095 along with an English translation of the Written Opinion of the International Searching Authority.
(Continued)

*Primary Examiner* — Mamadou Diallo
(74) *Attorney, Agent, or Firm* — Nath, Goldberg & Meyer; Joshua B. Goldberg; Leonid D. Thenor

(57) ABSTRACT

The present invention provides a display panel, a manufacturing method thereof and a display device. The display panel comprises a first substrate, a display component provided on the first substrate, and a packaging structure for packaging the display component on the first substrate, wherein the packaging structure includes at least two first water blocking layers and at least one planarization layer that are stacked alternately above the display component, each first water blocking layer includes a plurality of first areas and a plurality of second areas, and joint lines between the first areas and the second areas in any two first water blocking layers are staggered with each other.

20 Claims, 3 Drawing Sheets

(56) References Cited

U.S. PATENT DOCUMENTS

| | | | |
|---|---|---|---|
| 2010/0265207 A1* | 10/2010 | Chen | G06F 3/0412 345/174 |
| 2013/0240848 A1* | 9/2013 | Lin | H01L 51/52 257/40 |
| 2014/0054803 A1 | 2/2014 | Chen et al. | |
| 2014/0132148 A1 | 5/2014 | Jang et al. | |
| 2015/0169094 A1* | 6/2015 | Liu | H01L 51/5262 345/173 |
| 2016/0028045 A1* | 1/2016 | He | H01L 51/524 257/40 |
| 2016/0043347 A1* | 2/2016 | Sun | H01L 51/5259 257/40 |

FOREIGN PATENT DOCUMENTS

| | | |
|---|---|---|
| CN | 103715366 A | 4/2014 |
| CN | 104269426 A | 1/2015 |

OTHER PUBLICATIONS

Office Action dated Aug. 2, 2016 issued in corresponding Chinese Application No. 201410440269.1.
"The Study of a Multilayer of Organic Inorganic Hybrid Thin Film Encapsulation Structure for Organic Light-Emitting Diodes", Jun. 3, 2011.

* cited by examiner

DISPLAY PANEL, MANUFACTURING METHOD THEREOF, AND DISPLAY DEVICE

This is a National Phase Application filed under 35 U.S.C. 371 as a national stage of PCT/CN2015/071095, filed Jan. 20, 2015, an application claiming the benefit of Chinese Application No. 201410440269.1, filed Sep. 1, 2014, the content of each of which is hereby incorporated by reference in its entirety.

FIELD OF THE INVENTION

The present invention relates to the field of flexible display technology, and particularly relates to a display panel, a manufacturing method thereof, and a display device.

BACKGROUND OF THE INVENTION

Organic Light-Emitting Diodes (OLEDs) are regarded as the most promising components for flat panel display, and meanwhile are considered as the components that are most likely to implement flexible display components.

An OLED generally includes an anode, a cathode, a light-emitting layer, a hole transport layer and an electron transport layer, and when power supply reaches an appropriate voltage, the applied voltage drives electrons and holes to inject into the electron transport layer and the hole transport layer from the cathode and anode, respectively. The electrons and holes meet and combine during transmission, i.e., the so-called electron-hole recombination occurs, to generate photons. Holes at the anode and electrons at the cathode will combine in the light-emitting layer to emit light.

Currently, the service life of the OLED restrains industrialization thereof. When electrons are injected into the electron transport layer from the cathode during operation of the OLED, in order to increase the number of the injected carriers and improve luminous efficiency, the cathode of the OLED is made from a material with a similar work function as the light-emitting layer to reduce the energy barrier. However, such material having a low work function (e.g., magnesium, aluminum, silver, etc.) is generally reactive metal material and is very prone to react with water and oxygen in the external environment to disable the OLED. Meanwhile, the hole transport layer and the electron transport layer are easily eroded by water and oxygen, resulting in damaged pixels and shortened service life of the component. Therefore, packaging technique for OLED is particularly important. Effective packaging can prevent water vapor and oxygen from invading, prevent organic material from ageing and prolong the service life of the OLED.

In practical operation, the operation of the OLED will be badly influenced even when 10% of the cathode thereof is eroded, and similarly, a flexible OLED also needs to be packaged. At present, there are mainly two packaging techniques for OLEDs, namely, cover plate packaging and film packaging. For the cover plate packaging, glass cover plate material is mainly employed, which leads to relatively large thickness and relatively tightened sealing, however, the glass cover plate packaging can hardly satisfy the bendability of a flexible OLED. For the film packaging, film material is mainly employed, which leads to relatively small thickness and good flexibility, and is therefore commonly used for packaging a flexible OLED. The film packaging includes single-layer film packaging and multilayer film packaging, and in order to achieve a packaging effect comparable to that of the glass cover plate packaging, a flexible OLED often employs a multilayer film packaging structure. As shown in FIG. 1, the flexible OLED 6 employs a multiplayer film packaging structure in which inorganic material film layers 4 and organic material film layers 5 are laminated alternately. The inorganic material film layer 4 can prevent water vapor in the external environment from invading into the inside of the flexible OLED 6, and the organic material film layer 5 has good flexibility and can enhance the overall flexibility of the multilayer film packaging structure.

The multilayer film packaging structure typically has a relatively large thickness (can reach a couple of microns), due to the influence of stress and defect, the inorganic material film layer 4 is likely to crack when the flexible OLED display component is bent. For example, because of a crack or pinhole existing inside the inorganic material film layer 4 and stress mismatch between the inorganic material film layer 4 and adjacent organic material film layer 5 when they are in contact with each other, the inorganic material film layer 4 is very likely to crack along the position of the defect (e.g., crack or pinhole) when the packaging structure is bent along with the flexible OLED display component, which makes the bendability of the packaging component of the flexible OLED unsatisfactory.

SUMMARY OF THE INVENTION

In view of the above technical problem, an object of the present invention is to provide a display panel, a manufacturing method thereof and a display device. When the display panel is bent, the stress applied on a first water blocking layer along the position of a defect such as crack or pinhole can be dispersed, so that the cracking path of the first water blocking layer is blocked, thereby improving the bendability of the display panel.

According to an aspect of the present invention, there is provided a display panel, which comprises a first substrate, a display component provided on the first substrate, and a packaging structure for packaging the display component on the first substrate, wherein the packaging structure includes at least two first water blocking layers and at least one planarization layer that are stacked alternately above the display component, each first water blocking layer includes a plurality of first areas and a plurality of second areas, and joint lines between the first areas and the second areas in any two first water blocking layers are staggered with each other.

Preferably, in each first water blocking layer, the plurality of first areas and the plurality of second areas are arranged alternately in both row and column directions.

Preferably, for any two adjacent first water blocking layers, area of the first water blocking layer away from the display component is larger than that of the first water blocking layer close to the display component.

Preferably, for any planarization layer and first water blocking layer that are adjacent to each other, area of the planarization layer away from the display component is larger than that of the first water blocking layer close to the display component; area of the planarization layer close to the display component is smaller than that of the first water blocking layer away from the display component.

Preferably, thickness of the planarization layer is larger than that of the first water blocking layer.

Preferably, the first water blocking layer is made of an inorganic material, and the planarization layer is made of an organic material.

Preferably, the packaging structure further includes at least one second water blocking layer, which is stacked over the display component and is made of an inorganic material.

According to another aspect of the present invention, there is provided a display device comprising any one of the above-described display panel.

According to still another aspect of the present invention, there is provided a manufacturing method of a display panel, comprising steps of:

forming a display component on a first substrate; and forming a packaging structure above the display component, wherein the step of forming a packaging structure above the display component includes: forming at least two first water blocking layers and at least one planarization layer that are alternately formed above the display component, each first water blocking layer includes a plurality of first areas and a plurality of second areas, and joint lines between the first areas and the second areas in any two first water blocking layers are staggered with each other.

Preferably, forming the first water blocking layer specifically includes:

step S1: arranging a first mask plate provided with first area patterns, with the first area patterns corresponding to areas where the plurality of first areas are to be formed;

step S2: forming the plurality of first areas of the first water blocking layer by way of deposition;

step S3: arranging a second mask plate provided with second area patterns, with the second area patterns corresponding to areas where the plurality of second areas are to be formed; and step S4: forming the plurality of second areas of the first water blocking layer by way of deposition.

Preferably, the first areas and the second areas are formed by way of physical sputter deposition or chemical vapor deposition.

Preferably, forming the planarization layer specifically includes:

step S5: arranging a third mask plate provided with a planarization layer pattern, with the planarization layer pattern corresponding to an area where the planarization layer is to be formed;

step S6: forming the planarization layer by way of coating, printing or chemical vapor deposition; and step S7: curing the planarization layer by heating or irradiating with LED blue light.

In the display panel provided by the present invention or the display panel manufactured by using the manufacturing method of a display panel provided by the present invention, each first water blocking layer is divided into a plurality of first areas and a plurality of second areas, and the joint lines between the first areas and the second areas in any two first water blocking layers are staggered with each other, so that stress applied to the first water blocking layer along the position of a defect such as crack or pinhole can be dispersed when the display panel is bent, so that the cracking path of the first water blocking layer is blocked, thereby improving the bendability of the display panel.

In the display device provided by the present invention, by adopting the above-described display panel, the bendability of the display device is improved.

DETAILED DESCRIPTION OF THE EMBODIMENTS

To make a person skilled in the art better understand the technical solutions of the present invention, a display panel, a manufacturing method thereof, and a display device are described in detail below in conjunction with the accompanying drawings and specific implementations.

Figure 1:
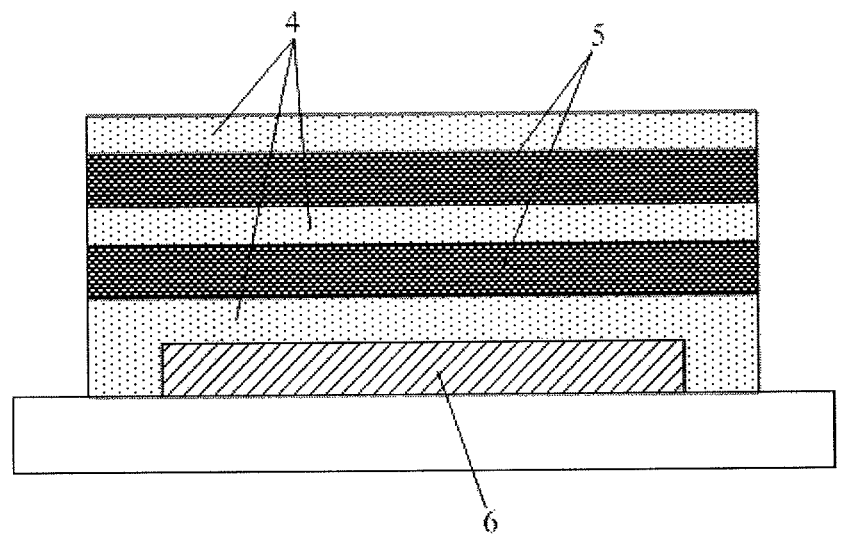
FIG. 1 is a schematic diagram of a structure of a display panel in the prior art.
Figure 2:
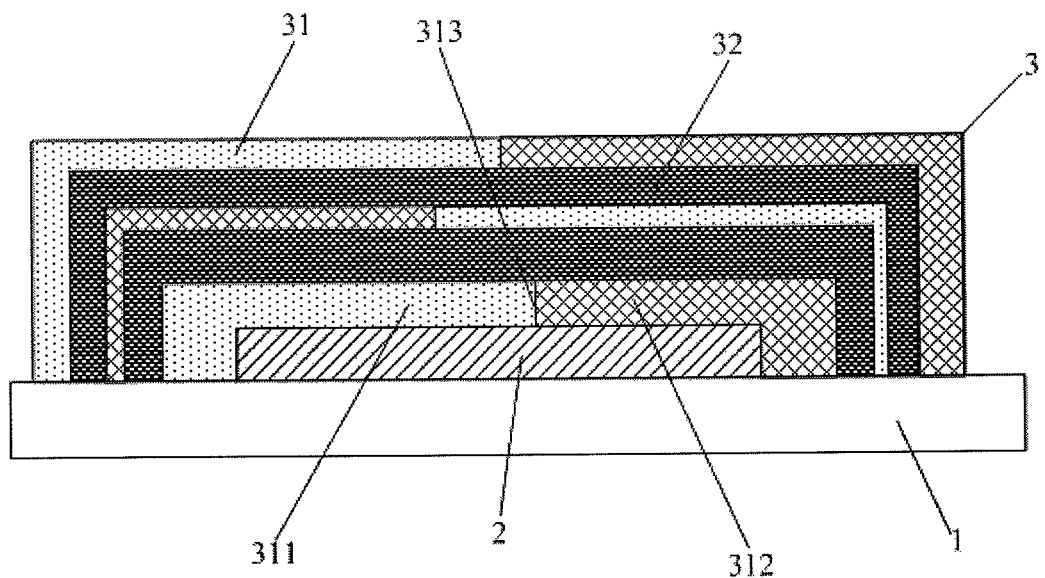
FIG. 2 is a schematic diagram of a structure of a display panel provided by a first embodiment of the present invention.

According to an embodiment of the present invention, there is provided a display panel, which, as shown in FIG. 2, includes a first substrate 1, a display component 2 provided on the first substrate 1, and a packaging structure 3 for packaging the display component 2 on the first substrate 1. The packaging structure 3 includes at least two first water blocking layers 31 and at least one planarization layer 32 that are stacked alternately above the display component 2, each first water blocking layer 31 includes a plurality of first areas 311 and a plurality of second areas 312, and joint lines 313 between the first areas 311 and the second areas 312 in any two first water blocking layers 31 are staggered with each other.

With such configuration, when the display panel is bent, stress applied to the first water blocking layer 31 along the position of a defect such as crack or pinhole can be dispersed, so that the cracking path of the first water blocking layer 31 is blocked, thereby improving the bendability of the display panel.

First Embodiment

In this embodiment, the packaging structure 3 includes three first water blocking layers 31 and two planarization layers 32. The display component 2 is an OLED display component, and the display panel with the OLED display component can be bent flexibly.

Figure 3:
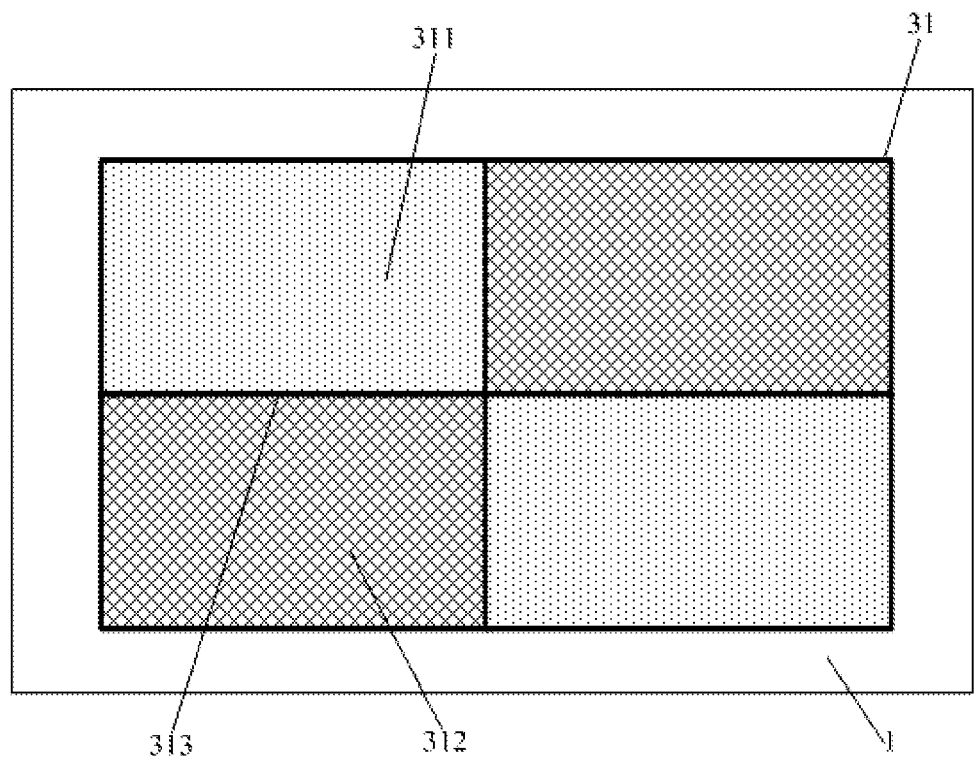
FIG. 3 is a schematic diagram of a structure of a first water blocking layer in the display panel shown in FIG. 2.

In this embodiment, as shown in FIG. 3, in each first water blocking layer 31, the first areas 311 and the second areas 312 are arranged alternately in both row and column directions. Specifically, one first area 311 and one second area 312 are included in the row direction, and also, one first area 311 and one second area 312 are included in the column direction. With such configuration, when the display panel is bent, stress applied to each first water blocking layer 31 in both row and column directions can be better dispersed, so that the stress applied to the entire first water blocking layer 31 becomes uniform, which in turn leads to that the entire first blocking layer 31 can hardly crack at any position, thereby improving bendability of the display panel.

In this embodiment, for any two adjacent first water blocking layers 31, area of the first water blocking layer 31 away from the display component 2 (i.e., the upper first water blocking layer 31) is larger than that of the first water blocking layer 31 close to the display component 2 (i.e., the lower first water blocking layer 31). That is, the first water blocking layer 31 away from the display component 2 can completely cover the first water blocking layer 31 close to the display component 2. In this way, the first water blocking layers 31 can form multilayer packaging for the display component 2, and thus invasion of outside water vapor and oxygen into the display panel to damage the display panel can be better avoided.

In this embodiment, for any planarization layer 32 and first water blocking layer 31 which are adjacent to each other, if the planarization layer 32 is positioned above the first water blocking layer 31 (i.e., the planarization layer 32 is farther away from the display component 2 than the first water blocking layer 31), area of the planarization layer 32 is larger than that of the first water blocking layer 31; if the planarization layer 32 is positioned below the first water blocking layer 31 (i.e., the planarization layer 32 is closer to the display component 2 than the first water blocking layer 31), the area of the planarization layer 32 is smaller than that of the first water blocking layer 31. With such configuration, the adjacent planarization layer 32 and first water blocking layer 31 can be closely fitted to each other. Meanwhile, since the first water blocking layer 31 can effectively prevent water vapor and oxygen in the external environment from invading into the inside of the display panel, and the planarization layer 32 not only has good flexibility but can also make it more even between layers of the packaging films, the above-described packaging structure not only can package the OLED display component well, so as to avoid invasion of water vapor and oxygen in the external environment, but also can cause the first water blocking layer 31 not to crack easily, so as to improve bendability of the display panel.

It should be noted that, for any planarization layer 32 and first water blocking layer 31 which are adjacent to each other, the area of the upper planarization layer 32 (i.e., the planarization layer 32 away from the display component 2) may be smaller than or equal to that of the lower first water blocking layer 31 (i.e., the first water blocking layer 31 close to the display component 2), as long as it is ensured that the planarization layer 32 can make it more even between layers of the packaging films. In this case, the first water blocking layer 31 can hardly crack.

In this embodiment, preferably, thickness of the planarization layer 32 is larger than that of the first water blocking layer 31 adjacent thereto. The first water blocking layer 31 is made of an inorganic material, and the planarization layer 32 is made of an organic material. The planarization layer 32 formed by the organic material has good flexibility, and the planarization layer 32 with larger thickness can make it more even between layers of the packaging films. The first water blocking layer 31 formed by the inorganic material can hardly crack due to its smaller thickness. In addition, by providing one planarization layer 32 with larger thickness on or beneath each first water blocking layer 31 with smaller thickness, the first water blocking layer 31 can even more hardly crack, thereby further improving bendability of the display panel.

Of course, the thickness of the planarization layer 32 may be smaller than or equal to the thickness of the first water blocking layer 31 adjacent thereto, which can also make, to a certain extent, each first water blocking layer 31 not prone to crack, thereby improving bendability of the display panel.

This embodiment further provides a manufacturing method of the above-described display panel, includes steps of: forming a display component on a first substrate; and forming a packaging structure above the first substrate with the display component formed thereon. Forming the packaging structure includes: forming at least two first water blocking layers and at least one planarization layer, wherein the first water blocking layers and the planarization layer(s) are alternately formed above the display component, each first water blocking layer includes a plurality of first areas and a plurality of second areas, and joint lines between the first areas and the second areas in any two first water blocking layers are staggered with each other.

Specifically, forming the first water blocking layer specifically includes steps S1 to S4.

In step S1, a first mask plate provided with first area patterns is arranged above the first substrate such that the first area patterns correspond to areas where the plurality of first areas are to be formed.

In this step, the first area patterns in the first mask plate are openings, which are provided in the first mask plate and correspond to patterns of the first areas in the first water blocking layer, and portion other than the openings is the mask plate with uniform thickness. The first area patterns in form of openings facilitate subsequent formation of the first areas by one-time deposition.

In step S2, the plurality of first areas of the first water blocking layer are formed by way of deposition.

In this step, the first areas are formed by way of physical sputter deposition or chemical vapor deposition. The first areas are directly deposited and formed in the openings of the first mask plate (i.e., the first area patterns) without any other process, which is very simple and convenient.

In step S3, a second mask plate provided with second area patterns is arranged on the first substrate subjected to the above steps such that the second area patterns correspond to areas where the plurality of second areas are to be formed.

In this step, the second area patterns in the second mask plate are openings, which are provided in the second mask plate and correspond to patterns of the second areas in the first water blocking layer, and portion other than the openings is the mask plate with uniform thickness. The second area patterns in form of openings facilitate subsequent formation of the second areas by one-time deposition.

In step S4, the plurality of second areas of the first water blocking layer are formed by way of deposition.

In this step, the second areas are formed by way of physical sputter deposition or chemical vapor deposition. The second areas are directly deposited and formed in the openings of the second mask plate (i.e., the second area patterns) without any other process, which is very simple and convenient.

At this point, preparation of one first water blocking layer is finished. Next, one planarization layer is formed on said one first water blocking layer, and forming the planarization layer includes steps as follows.

In step S5, a third mask plate provided with a planarization layer pattern is arranged on the first substrate subjected to the above steps such that the planarization layer pattern corresponds to an area where the planarization layer is to be formed;

In this step, the planarization layer pattern in the third mask plate is an opening, which is provided in the third mask plate and corresponds to the pattern of the planarization layer, and portion other than the opening is the mask plate with uniform thickness. The planarization layer pattern in form of opening facilitates subsequent formation of the planarization layer by one-time deposition, printing or coating.

In step S6, the planarization layer is formed by way of coating, printing or chemical vapor deposition.

In this step, the planarization layer is directly deposited and formed in the opening of the third mask plate (i.e., the planarization layer pattern) without any other process, which is very simple and convenient. In addition, the planarization layer may be formed by way of screen printing.

In step S7, the planarization layer is cured by heating or irradiating with LED blue light.

At this point, preparation of one planarization layer is finished.

The above-described steps S1 to S4 and steps S5 to S7 may be performed repeatedly and alternately, until all of the first water blocking layers and planarization layer(s) are prepared. So far, preparation of the packaging structure for the OLED display component is finished, the packaging of the OLED display component is also finished, and meanwhile, preparation of the whole OLED display panel is finished.

It can be understood that, when repeating the steps S1 to S4 to form different first water blocking layers, the adopted first mask plates have different first area patterns from each other, and the adopted second mask plates also have different second area patterns from each other, so that in any two first water blocking layers, the joint lines between the first areas and the second areas in one first water blocking layer are staggered with those in the other first water blocking layer, and area of the first water blocking layer away from the display component is larger than that of the first water blocking layer close to the display component.

Similarly, when repeating the steps S5 to S7 to form different planarization layers, the adopted third mask plates may also have different planarization layer patterns.

In addition, in this embodiment, since the first water blocking layer can effectively prevent water vapor and oxygen in the external environment from invading into the inside of the display panel, preferably, the number of the first water blocking layers is one larger than the number of the planarization layer(s), so as to ensure that the outermost layer of the packaging structure is the first water blocking layer.

The above-described manufacturing method of a display panel has simple processes, and can improve manufacturing efficiency of display panels while ensuring that each first water blocking layer is not prone to crack to improve bendability of the display panel.

Second Embodiment

Figure 4:
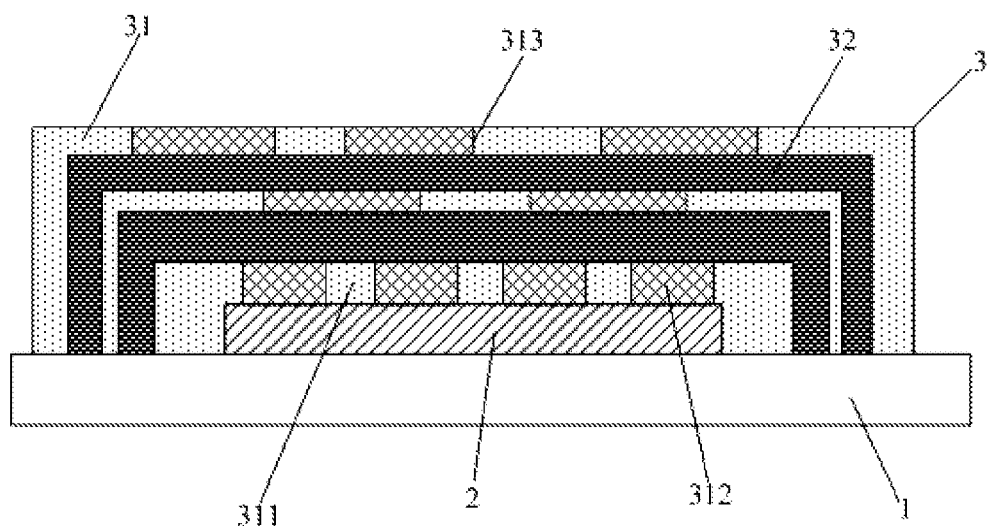
FIG. 4 is a schematic diagram of a structure of a display panel provided by a second embodiment of the present invention.
Figure 5:
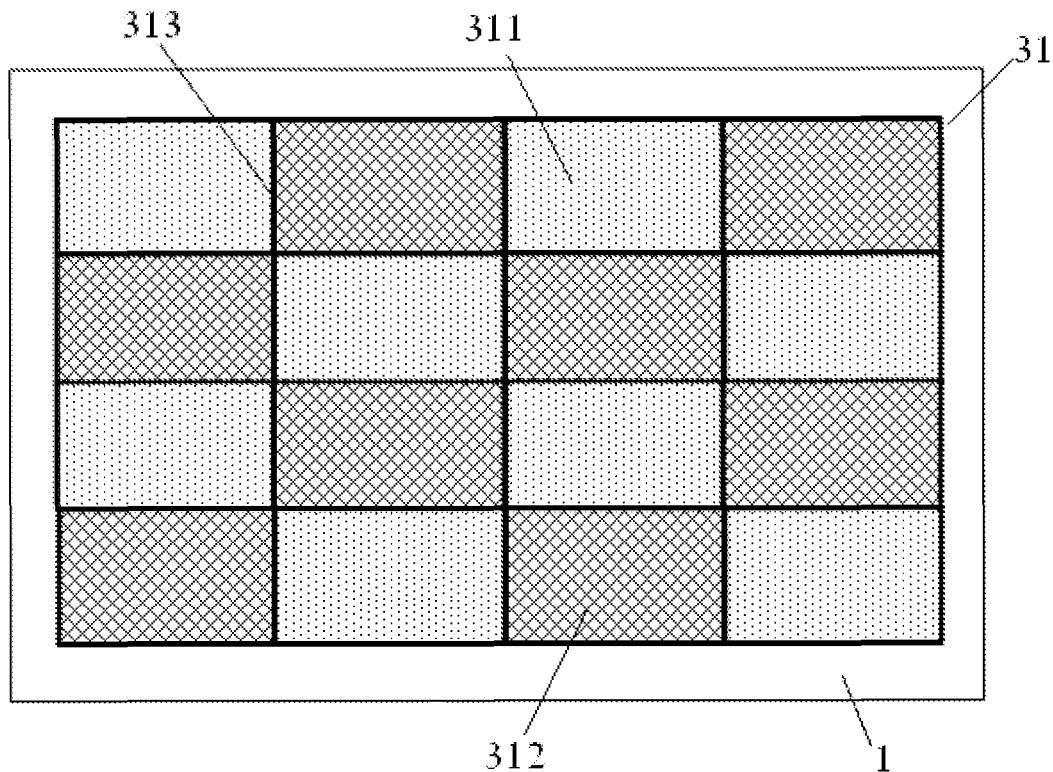
FIG. 5 is a schematic diagram of a structure of a first water blocking layer in the display panel shown in FIG. 4.

This embodiment provides a display panel, and as shown in FIGS. 4 and 5, in each first water blocking layer 31, the first areas 311 and the second areas 312 are arranged alternately in both row and column directions. What differs from the first embodiment is in that, a plurality of first areas 311 and a plurality of second areas 312 are included in both row and column directions.

It could be understood that, in each first water blocking layer 31, the numbers of the first areas 311 and the second areas 312 included in the row or column direction may be different, as long as the plurality of first areas 311 and the plurality of second areas 312 are arranged alternately, for example, the number of the first areas 311 may be one larger or smaller than the number of the second areas 312. Furthermore, the number of the first areas 311 or second areas 312 included in the row direction may be different from that included in the column direction, the numbers of the first areas 311 and the second areas 312 included in the row (or column) direction may be determined based on the size of the display panel as well as the sizes of the respective first areas 311 and second areas 312, and are not specifically limited herein.

In addition, sizes of the plurality of first areas 311 (or second areas 312) in each first water blocking layer 31 may be equal to or different from each other, as long as it can be ensured that in any two first water blocking layers 31, the joint lines 313 between the first areas and the second areas in one first water blocking layer 313 are staggered with those in the other first water blocking layer 313.

Other structures of the display panel and the manufacturing method of a display panel in this embodiment are the same as those in the first embodiment, and are not repeated herein.

Third Embodiment

This embodiment provides a display panel, which differs from the first and second embodiments in that, the packaging structure in this embodiment further includes at least one second water blocking layer, which is stacked above the display component and is made of an inorganic material.

Figure 6:
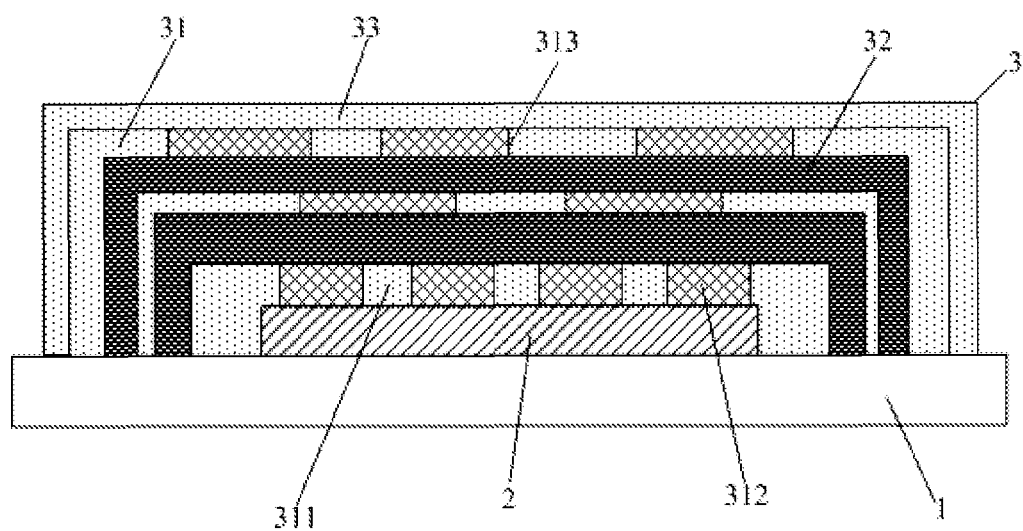
FIG. 6 is a schematic diagram of a structure of a display panel provided by a third embodiment of the present invention.

In this embodiment, as shown in FIG. 6, the packaging structure includes one second water blocking layer 33, which is stacked on the outermost layer above the display component 2 (i.e., is provided as the outermost layer of the packaging structure). Specifically, the second water blocking layer 33 is stacked on the first water blocking layer 31 farthest away from the display component 2.

Since the second water blocking layer 33 is not divided into first areas and second areas (i.e., the second water blocking layer 33 is an integral film layer), by providing the second water blocking layer 33, water vapor in the external environment can be further prevented from invading into the inside of the display component 2 through the joint lines 312 between the first areas 311 and the second areas 312 in the first water blocking layer 31, so as to better protect the display component 2.

It should be noted that, the second water blocking layer 33 may be stacked above the display component 2 at any position, for example, be provided next to the display component 2, or stacked on the outermost layer away from the display component 2 (as shown in FIG. 6), or sandwiched between the first water blocking layer 31 and the planarization layer 32. There may be a plurality of second water blocking layers 33.

Here, area of the second water blocking layer 33 is not limited, and the second water blocking layer 33 preferably covers all joint lies 313 in the first water blocking layer 31 adjacent thereto.

Other structures of the display panel in this embodiment are the same as those in the first or second embodiment, and are not repeated herein.

Beneficial effects achieved by the first to third embodiments are as follows: in the display panels provided by the first to third embodiments, each first water blocking layer is divided into a plurality of first areas and a plurality of second areas, and the joint lines between the first areas and the second areas in any two first water blocking layers are staggered with each other, so that stress applied to the first water blocking layer along the position of a defect such as crack or pinhole can be dispersed when the display panel is bent, so that the cracking path of the first water blocking layer is blocked, thereby improving the bendability of the display panel.

Fourth Embodiment

This embodiment provides a display device comprising the display panels in any one of the first to third embodiments.

By adopting the display panel in any one of the first to third embodiments, the bendability of the display device can be improved.

The above-described display panel may be any product or member with a display function such as an electronic paper, an OLED display panel, a mobile phone, a tablet computer, a television, a display, a notebook computer, a digital photo frame, a navigator or the like.

It could be understood that the above implementations are only exemplary implementations for illustrating the principle of the present invention, but the present invention is not limited thereto. Various variations and improvements can be made by those skilled in the art without departing from the spirit and essence of the present invention, and these variations and improvements are also considered to be within the protection scope of the present invention.

The invention claimed is:

1. A display panel, comprising a first substrate, a display component provided on the first substrate, and a packaging structure for packaging the display component on the first substrate, wherein the packaging structure includes at least two first water blocking layers and at least one planarization layer that are stacked alternately above the display component, each first water blocking layer includes a plurality of first areas and a plurality of second areas, and joint lines between the first areas and the second areas in any two first water blocking layers are staggered with each other; and wherein, in each first water blocking layer, the plurality of first areas and the plurality of second areas are arranged alternately in both row and column directions.

2. The display panel according to claim 1, wherein, for any two adjacent first water blocking layers, area of the first water blocking layer away from the display component is larger than that of the first water blocking layer close to the display component.

3. The display panel according to claim 1, wherein, for any planarization layer and first water blocking layer that are adjacent to each other, area of the planarization layer away from the display component is larger than that of the first water blocking layer close to the display component; area of the planarization layer close to the display component is smaller than that of the first water blocking layer away from the display component.

4. The display panel according to claim 1, wherein, thickness of the planarization layer is larger than that of the first water blocking layer adjacent thereto.

5. The display panel according to claim 1, wherein, the first water blocking layer is made of an inorganic material, and the planarization layer is made of an organic material.

6. The display panel according to claim 5, wherein, the packaging structure further includes at least one second water blocking layer, which is stacked over the display component and is made of an inorganic material.

7. The display panel according to claim 6, wherein, each second water blocking layer is an integral film layer and covers all of the joint lines in the first water blocking layer adjacent thereto.

8. The display panel according to claim 7, wherein, at least one second water blocking layer is provided as the outermost layer of the packaging structure.

9. A display device, comprising a display panel, which comprises a first substrate, a display component provided on the first substrate, and a packaging structure for packaging the display component on the first substrate, wherein the packaging structure includes at least two first water blocking layers and at least one planarization layer that are stacked alternately above the display component, each first water blocking layer includes a plurality of first areas and a plurality of second areas, and joint lines between the first areas and the second areas in any two first water blocking layers are staggered with each other; and wherein, in each first water blocking layer, the plurality of first areas and the plurality of second areas are arranged alternately in both row and column directions.

10. The display device according to claim 9, wherein, for any two adjacent first water blocking layers, area of the first water blocking layer away from the display component is larger than that of the first water blocking layer close to the display component.

11. The display device according to claim 9, wherein, for any planarization layer and first water blocking layer that are adjacent to each other, area of the planarization layer away from the display component is larger than that of the first water blocking layer close to the display component; area of the planarization layer close to the display component is smaller than that of the first water blocking layer away from the display component.

12. The display device according to claim 9, wherein, thickness of the planarization layer is larger than that of the first water blocking layer adjacent thereto.

13. The display device according to claim 9, wherein, the first water blocking layer is made of an inorganic material, and the planarization layer is made of an organic material.

14. The display device according to claim 13, wherein, the packaging structure further includes at least one second water blocking layer, which is stacked over the display component and is made of an inorganic material.

15. The display device according to claim 14, wherein, each second water blocking layer is an integral film layer and covers all of the joint lines in the first water blocking layer adjacent thereto.

16. The display device according to claim 15, wherein, at least one second water blocking layer is provided as the outermost layer of the packaging structure.

17. A manufacturing method of a display panel, comprising steps of:

forming a display component on a first substrate; and forming a packaging structure above the display component, wherein the step of forming the packaging structure above the display component includes:

forming at least two first water blocking layers and at least one planarization layer that are alternately formed above the display component, each first water blocking layer includes a plurality of first areas and a plurality of second areas, and joint lines between the first areas and the second areas in any two first water blocking layers are staggered with each other; and in each first water blocking layer, the plurality of first areas and the plurality of second areas are arranged alternately in both row and column directions.

18. The manufacturing method of a display panel according to claim 17, wherein, forming the first water blocking layers specifically includes:

step S1: arranging a first mask plate provided with first area patterns, with the first area patterns corresponding to areas where the plurality of first areas are to be formed;

step S2: forming the plurality of first areas of the first water blocking layer by way of deposition;

step S3: arranging a second mask plate provided with second area patterns, with the second area patterns corresponding to areas where the plurality of second areas are to be formed; and step S4: forming the plurality of second areas of the first water blocking layer by way of deposition.

19. The manufacturing method of a display panel according to claim 18, wherein, the first areas and the second areas are formed by way of physical sputter deposition or chemical vapor deposition.

20. The manufacturing method of a display panel according to claim 18, wherein, forming the planarization layer specifically includes:

step S5: arranging a third mask plate provided with a planarization layer pattern, with the planarization layer pattern corresponding to an area where the planarization layer is to be formed;

step S6: forming the planarization layer by way of coating, printing or chemical vapor deposition; and step S7: curing the planarization layer by heating or irradiating with LED blue light.

* * * * *